United States Patent [19]

Russo, Jr.

[11] 3,900,769

[45] Aug. 19, 1975

[54] ELECTRONIC MODULAR PACKAGE HAVING A PRINTED CIRCUIT ASSEMBLY

[75] Inventor: Andrew Russo, Jr., Fowler, Ohio

[73] Assignee: General Motors Corporation, Detroit, Mich.

[22] Filed: June 13, 1974

[21] Appl. No.: 478,839

[52] U.S. Cl. .......... 317/101 DH

[51] Int. Cl.$^2$ .......... H02B 1/02

[58] Field of Search .......... 317/99, 101 R, 101 C, 101 DH;174/52 R, 52 S

[56] References Cited

UNITED STATES PATENTS

| | | | |
|---|---|---|---|
| 3,636,370 | 1/1972 | Samberger et al. | 317/101 DH |
| 3,829,604 | 8/1974 | Tanaka | 317/101 DH |

*Primary Examiner*—David Smith, Jr.
*Attorney, Agent, or Firm*—F. J. Fodale

[57] ABSTRACT

An electronic modular package comprises a printed circuit assembly with terminal blocks attached at each end of the circuit board. The printed circuit assembly is slid into an elongated hollow rugged plastic housing having an opening at each end which receive the terminal blocks. One of the terminal blocks cooperates with the housing to secure the printed circuit assembly in place while the other terminal block cooperates with the housing to prevent over-insertion. This functional division between the terminal blocks substantially isolates the circuit board and its multiplicity of soldered connections from the forces associated with attaching connectors to the terminal blocks.

2 Claims, 5 Drawing Figures

ELECTRONIC MODULAR PACKAGE HAVING A PRINTED CIRCUIT ASSEMBLY

This invention relates generally to modular packages and more specifically to modular packages containing a printed circuit of the hard board type, that is, one in which a circuit is printed on a thin board of plastic or the like which board although thin is self-supporting rather than flexible.

Broadly, the object of this invention is to provide a modular package containing a printed circuit of the hard board type which is rugged so as to protect the printed circuit from physical damage during handling and in its ultimate environment.

Another object of this invention is to provide such a modular package which may be electrically connected into an electrical system by conventional automotive type wiring harness or the like.

Another object of this invention is to provide such a modular package which may have two terminal blocks by which the printed circuit may be electrically connected to other electrical components outside the modular by wire harnesses while being substantially isolated from the forces associated with making the connections.

Yet another object of this invention is to provide such a modular package in which the printed circuit and soldered connections are isolated from the electrical components attached to the printed circuit by the soldered connections by the circuit board.

Yet still another object of this invention is to provide a modular package containing a printed circuit which package incorporates integral means for remountably securing the module to a support member.

Other objects and features of the invention will become apparent to those skilled in the art as the disclosure is made in the following detailed description of a preferred embodiment of the invention as illustrated in the accompanying sheet of drawings in which.

Figure 1:
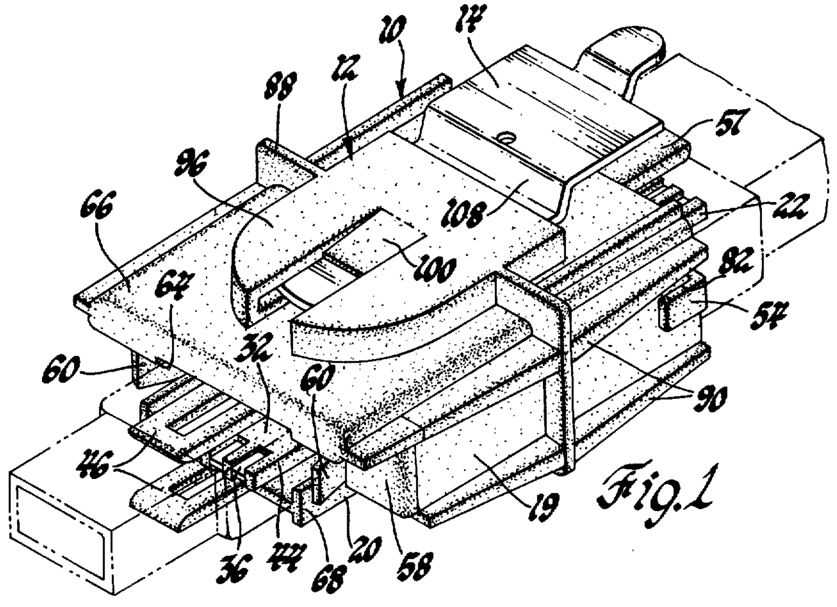
FIG. 1 is a perspective view of a modular package in accordance with this invention.
Figure 2:
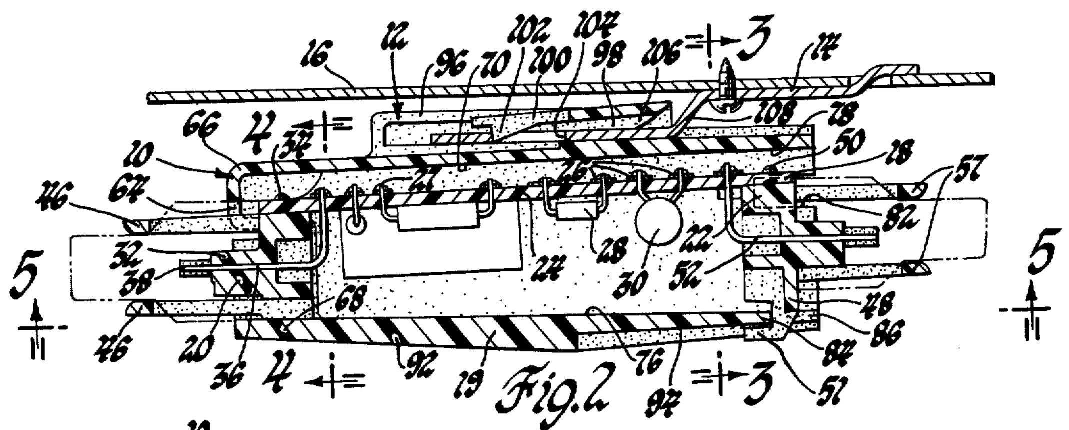
FIG. 2 is an axial section of the modular package shown in FIG. 1.

Referring now to the drawings and particularly to FIG. 1, there is shown an electronic modular package 10 which contains a printed circuit board which may be used for instance as the base for a logic control circuit for an automobile seatbelt-ignition interlock system which is designed to require the front seat occupants to latch their seatbelts before starting the automobile. For use in such environments or the like, the electronic modular package 10 includes a latch mechanism 12 for securing the modular package 10 to a D-ring retainer 14 suspended from a frame member on the underside of the front seat of the automobile and terminal blocks 20 and 22 at the opposite ends of the package for attaching conventional wiring harnesses to electrically connect the modular package 10 to other electrical components of the system, such as occupant sensitive seat switches, ignition switch, etc. In FIG. 1 the front seat is not shown but the underside frame member 16 from which the D-ring retainer is suspended is shown in FIG. 2. The conventional wiring harnesses have likewise been omitted, however, the connectors at the ends thereof which connect to the terminal blocks are shown in phantom in FIGS. 1, 2 and 5.

Referring now to FIG. 2, the modular package 10 comprises a printed circuit assembly 18 which is slid into an elongated, open ended housing 19 of generally rectangular cross section and secured therein by the terminal blocks 20 and 22 which are part of the printed circuit assembly 18.

More particularly the printed circuit assembly 18 comprises a hard plastic circuit board 24 having an electrical circuit 26 printed on the top side. Several holes penetrate various portions of the printed circuit 26 and extend through the circuit board 24 to its bare bottom side. Other electrical components for the logic control circuit, such as resistors 28, capacitor 30, etc., are located beneath the circuit board 24 and attached thereto by tab terminals 27 protruding through the holes and soldered to the printed circuit 26 on the top side of the circuit board 24.

The logic control circuit (printed circuit 26 and components, such as resistors 28 and capacitor 30) is electrically connected to other components of the seatbelt-ignition interlock system by means of the terminal blocks 20 and 22 which are secured to the opposite ends of the circuit board 24. More specifically the terminal block 20 comprises a hard plastic insulator body 32 located on the bottom side of the circuit board 24 at the left end as viewed in FIG. 2 and secured to the circuit board by rivets 34 or other suitable fastening means. The insulator body 32 may also have raised projections (not shown) cooperating with locating holes (not shown) in the circuit board for properly positioning the terminal block 20 for the fastening operation.

The insulator body 32 has four axial passages 36 in which are disposed theh axial legs of right angled male terminals 38. The radial legs of the male terminals 38 protrude through holes in the circuit board 24 and are soldered to the printed circuit 26 at various locations in the printed circuit 26. The portions of the male terminals 38 located in the axial passages 36 are lock tang sections which mechanically secure the terminal. The portions of the male terminals 38 between the lock tang sections and the solder joint is designed as a leaf spring to minimize stress in event of shifts between the insulator body 32 and the circuit board 24 due to moisture or temperature changes.

The insulator body 32 has two L-shaped skid ribs 40 on its bottom and a locking ramp 42 on each side. See FIGS. 4 and 5. The outboard portion of the insulator body 32 has a central plug portion 44 which carries the partially exposed ends of the terminals 38 and upper and lower slotted deflectable latch arms 46 for cooperation with a mating female connector carried at the end of a wiring harness. See particularly FIG. 1 in which the mating female connection is shown in phantom.

The terminal block 22 comprises a hard plastic insulator body 48 which is located on the bottom side of the circuit board 24 at the right end as viewed in FIG. 2 and secured thereto by rivets 50 or the like. The insulator body 48 may also have projections (not shown) cooperating with locating holes (not shown) in the circuit board 24 for properly positioning the terminal block 22 for the fastening operation.

The insulator body 48 has ten axial passages in which are disposed the axial legs of right angled male terminals 52. The radial legs of the male terminals 52 protrude through holes in the circuit board and are soldered to the printed circuit 26 at various locations in the printed circuit. The portions of the male terminals 52 located in the axial passages 36 are lock tang sections which mechanically secure the terminal. The portions of the male terminals 52 between the lock tang sections and the solder joint is designed as a leaf spring to minimize stress in event of shifts between the insulator body 48 and the circuit board 24 due to moisture or temperature changes.

The insulator body 48 has a comb-shaped skid rib 50 on its bottom and a depending hook 51 facing toward the inboard side of the insulator body. Integral hooks 54 protruding from each side of the insulator body 48 together with the hook 51 provide a triangular stop as will hereinafter be more fully explained. See FIGS. 3 and 5.

Figures 3, 4, 5:
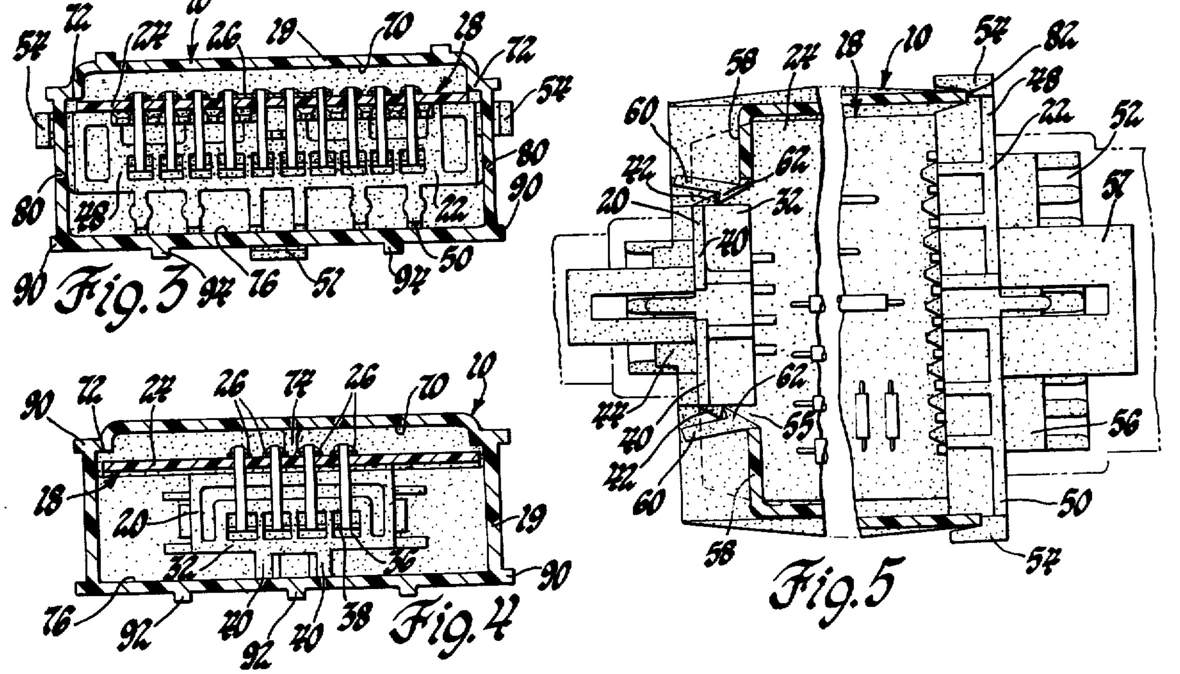
FIG. 3 is a section taken substantially along the line 3—3 of FIG. 2.
FIG. 4 is a section taken substantially along the line 4—4 of FIG. 2.
FIG. 5 is a section taken substantially along the line 5—5 of FIG. 2.

The outboard portion of the insulator body 48 has a central male portion 56 which carries the partially exposed ends of the male terminals 52 and upper and lower slotted deflectable latch arms 57 for cooperation with a female connector block carried at the end of a wiring harness which is shown in phantom in FIGS. 1, 2 and 5.

The printed circuit assembly 18 which includes the terminal blocks 20 and 22 having been described is disposed in the housing 19 which will now be described in detail.

The housing 19 is a hollow elongated body of generally rectangular cross section which is molded from a strong plastic material having good electrical insulating properties. The forward end (left end as viewed in FIGS. 1, 2 and 5) of the housing 19 has a smaller opening 55 defined in part by the recessed front walls 58 which have generally axial deflectable arms 60 integrally connected to their edges adjacent the opening 56. The arms 60 include ramp latches 62 which cooperate with the locking ramps 42 of the insulator body 32. The upper and lower portions of the smaller opening 55 are defined respectively by a slot 64 in the upper protruding nose section 66 and a lower channel-shaped lip 68 of the housing 19. The height of the smaller opening 55 is substantially equal to that of the insulator body 32 and the thickness of the circuit board 24 while the width of the opening 55 particularly those portions defined by the slot 64 and the lip 68 is substantially equal to that of the insulator body 32, both of which have a width considerably less than the width of the circuit board 24.

The ceiling 70 of the housing 19 has longitudinal side rails 72 which engage the side portions of the circuit board 24 so that the protruding soldered tab terminal ends of the electronic components attached to the circuit board 24 are spaced from the ceiling 70 thereby avoiding the possibility of damage to the solder connections. The portion of the ceiling 70 provided by the nose section 64 has a short central rib 74 which also engages the circuit board 24 to properly locate the terminal block 20 in the vertical direction as well as space the circuit board 24 from the ceiling 70. The floor 76 of the housing 19 including that portion provided by the lip 68 is a substantially planar surface uninterrupted by protrusions so that the skid ribs 40 of the terminal block 20 may be slid therealong from the right end to the position shown in FIGS. 1, 2 and 3.

The housing 19 has a larger rear opening 78 which is substantially the same width as the insulator body 48 of the terminal block 20 which width in turn is slightly wider than the circuit board 24 so that the side edges of the circuit board 24 are spaced slightly from the side walls 80 of the housing 19. The rear portions of the side walls 80 have notches 82 and the rear portion of the housing bottom wall 84 has a central notch 86 which respectively receive the hooks 54 and 51 of the insulator body 48.

The housing 19 is of extremely rugged design having a central exterior flange 88 and longitudinally, laterally extending ribs 90 at the four corners. The bottom wall 84 likewise is heavily ribbed with three central ribs 92 extending forwardly from the flange to the free end of the lip 68 and two spaced ribs 94 extending rearwardly to the rear end of the housing 19.

As previously mentioned, the modular package 10 includes a latch mechanism 12 for securing the module to a D-ring retainer 14. More specifically the latch mechanism comprises an integral dome 96 on the top of the housing 19 which provides a horizontal slot 98 which receives the D-ring retainer 14. The forward curved end of the dome 96 which lies ahead of the flange 88 has a central vertical slot in which is disposed a shorter integral deflectable arm 100 having a ramp latch 102 which engages an aperture 104 in the D-ring retainer 14. The rear section of the dome 96 is U-shaped in cross section and has two depending ribs 106 for increased rigidity and vertical location of the D-ring retainer 14 in the horizontal slot 98. The D-ring retainer 14 may be suitably suspended from any suitable support structure such as by the tongue and groove and sheet metal screw arrangement which suspends the D-ring retainer 14 from the underside frame member 16. The riser 108 of the stepped D-ring retainer 14 may be conveniently placed so as to provide a stop to prevent over-insertion.

In manufacturing the modular package 10, the printed circuit assembly 18 is completed apart from the housing 19. The two parts forming the modular package are assembled simply by inserting the terminal block 20 affixed to the forward end of the circuit board 24 into the larger opening 78 at the rear of the housing 19 and sliding the L-shaped skid rib 40 along the floor 76 until the terminal block 20 passes through the smaller opening 64 at the forward end of the housing 19. Lateral guidance is initially provided by the circuit board 24 which may have its leading edges 25 tapered to aid in the initial insertion. More precise, lateral guidance is provided as the terminal block 20 enters the opening 56 by the side edges of the slot 64 and the vertical walls of the lip 68. Alignment adjustments for entering the opening 56 may be aided by cutting away the inside corners of the bottom walls of the nose section 66 and chamfering the corners between the vertical walls of the lip 68 and the front walls 58. When the terminal block 20 enters the opening 56, the locking ramps 42 engage the ramp latches 62 camming the arms 60 outwardly. Continued movement allows the arms 60 to return inwardly under their self-biasing forces to the position shown in FIG. 5 where the ramp latches 62 are hooked behind the locking ramps 42. In this latched condition, the hooks 52 and 54 of the terminal block 22 are respectively disposed in the notches 82 and 86 of housing 19 which causes the side walls of the insulator body 48 to engage the side walls 80 of the housing and the comb-shaped skid rib 50 to engage the floor 76.

Alternatively, the modular package 10 may be assembled by turning the housing 19 and printed circuit assembly 18 upside down and sliding the edges of the printed circuit board 24 along the side rails 72. In either event, the assembled modular package 10 is a rugged, compact structure which may be transported to a factory assembly area and easily mounted on an unsophisticated support structure such as a suspended D-ring retainer and easily electrically connected to other components of an electrical system, such as a seatbelt-ignition interlock system by conventional wiring harnesses equipped with the proper mating connectors for the terminal blocks. More specifically, the modular package 10 may be readily supported on the underside of an automobile seat simply by sliding the dome 96 of the housing 19 over the free end of the D-ring retainer 14 suspended from the underside frame member 16 until the dome 96 engages the riser 108 and the ramp latch 102 engages in the aperture 104.

Once secured in this manner, the modular package 10 may then be incorporated into the seatbelt-ignition interlock system simply by plugging in mating female connections of conventional design carried by the ends of conventional wiring harnesses which lead to the various other electrical components of the system. In this regard, it should be particularly noted that the sole means preventing withdrawal of the printed circuit assembly 18, that is, movement toward the right with respect to the housing 19 as viewed in FIG. 2, is the latch means comprising the interlocking locking ramps 42 and ramp latches 62 of the terminal block 20 and housing 19 respectively. Consequently the predominately axial forces associated with pushing the female connector onto the terminal block 20 are transferred from the terminal block 20 to the rugged housing 19 thus substantially isolating the relatively thin circuit board 24 and solder connections thereon from the significant forces associated with attaching the female connector. Similarly, the sole means preventing over-insertion, that is, relative movement in the opposite direction, is the triangular stop means comprising the hooks 52 and 54 of the terminal block 22 and the notches 86 and 82 of the housing 19. Consequently the circuit board 24 and solder connection are also substantially isolated from the forces associated with pushing the female connector of the second wiring harness onto the terminal block 22.

The modular unit 10 may be removed and opened for repair by first spreading the latch arms 46 and 47 and disconnecting the female connectors and associated wiring harnesses. The modular unit 10 may then be demounted by inserting a screwdriver or the like into the vertical slot in the front section of the dome 96 and lifting the ramp latch 102 out of the aperture 104 whereupon the modular unit 10 may be slid off the D-ring retainer 14. Once demounted, the modular unit may be disassembled by spreading the arms 60 and pushing the terminal block 20 which partially withdraws the printed circuit assembly 18 from the housing 19. The entire assembly 18 is then removed simply by grasping the terminal block 22 and completing the withdrawal.

I wish it to be understood that I do not desire to be limited to the exact details of construction shown and described, for obvious modifications will occur to a person skilled in the art.

What is claimed is:

1. An electronic modular package having a printed circuit assembly comprising:

a hard circuit board having first and second terminal blocks secured thereto adjacent the opposite ends thereof respectively, said first terminal block having a width less than that of the end portion of said circuit board to which it is secured, said second terminal block having a width greater than the width of said first terminal block and slightly greater than the maximum width of said circuit board.

a rigid plastic, hollow elongated housing of generally rectangular cross section having a larger opening at one end and a smaller opening at an opposite end, said circuit board being disposed in said housing by sliding said circuit board with said first and second terminal blocks secured thereto into said housing through said larger opening first terminal block first until said first terminal block is disposed in said smaller opening and said second terminal block is disposed in said larger opening.

latch means comprising cooperative portions of said first terminal block and portions of said housing adjacent said smaller aperture for securing said circuit board within said housing, said latch means constituting the sole means preventing withdrawal of said circuit board whereby said circuit board is substantially isolated from forces associated with pushing a mating connector onto said first terminal block, and stop means comprising cooperative portions of said second terminal block and said housing adjacent said larger opening for limiting insertion of said circuit board into said housing, said stop means constituting the sole means limiting insertion of said circuit board into said housing whereby said circuit board is substantially isolated from forces associated with pushing a mating connector onto said second terminal block.

2. An electronic modular package having a printed circuit assembly comprising:

a hard circuit board having an electrical circuit printed on a top surface thereof and a plurality of electrical components located below said circuit board and secured thereto by tab terminals extending through said circuit board with protruding end portions soldered to said printed circuit, first and second terminal blocks secured to said circuit board adjacent the opposite ends thereof respectively, said first terminal block having a width less than that of the end portion of said circuit board to which it is secured, said second terminal block having a width greater than the width of said first terminal block and slightly greater than the maximum width of said circuit boards, a rigid plastic, hollow elongated housing of generally rectangular cross section having a larger opening at one end, a smaller opening at an opposite end, a ceiling with side rails and a generally planar floor uninterrupted by protrusions, said circuit board being disposed in said housing by sliding said circuit board with said first and second terminal blocks secured thereto into said housing through said larger opening first end first until said first terminal block is disposed in said smaller opening and said second terminal block is disposed in said larger opening, said first and second terminal blocks supporting said circuit board and spacing said plurality of electrical components secured thereto from said floor, said side rails overlying the longitudinal edge portions of said circuit board and being of sufficient height to prevent the protruding ends of said tab terminals from engaging said ceiling, latch means comprising interlocked ramped portions of said first terminal block and said housing adjacent said smaller aperture for securing said circuit board within said housing, said latch means constituting the sole means preventing withdrawal of said circuit board whereby said circuit board is substantially isolated from forces associated with pushing a mating connector onto said first terminal block, stop means comprising triangularly arranged cooperative portions of said second terminal block and said housing adjacent said larger opening for limiting insertion of said circuit board into said housing, said stop means constituting the sole means limiting insertion of said circuit board whereby said circuit board is substantially isolated from forces associated with pushing a mating connector onto said second terminal block, and means for mounting said housing on a support member, said means including an integral dome atop said housing and a deflectable latch arm forming an integral part of said dome.

* * * * *